(12) United States Patent
Ritter et al.

(10) Patent No.: US 6,525,628 B1
(45) Date of Patent: Feb. 25, 2003

(54) SURFACE MOUNT RC ARRAY WITH NARROW TAB PORTIONS ON EACH OF THE ELECTRODE PLATES

(75) Inventors: Andrew P. Ritter, Surfside Beach, SC (US); Andrew Blair, Coleraine (IE); Maureen Strawhorne, Coleraine (IE); Clare Ashley Moore, Coleraine (IE); Robert H. Heistand, II, Pawleys Island, SC (US)

(73) Assignee: AVX Corporation, Myrtle Beach, SC (US)

( * ) Notice: Subject to any disclaimer, the term of this patent is extended or adjusted under 35 U.S.C. 154(b) by 0 days.

(21) Appl. No.: 09/335,991

(22) Filed: Jun. 18, 1999

(51) Int. Cl.$^7$ ................................................. H03H 1/02
(52) U.S. Cl. ................. 333/172; 361/321.2; 361/275.3; 361/330
(58) Field of Search ................. 333/172, 184, 333/185; 361/313, 321.2, 275.3, 330

(56) References Cited

U.S. PATENT DOCUMENTS

| | | |
|---|---|---|
| 2,405,515 A | 8/1946 | Neyzi |
| 2,694,185 A | 11/1954 | Kodama |
| 2,779,975 A | 2/1957 | Lee et al. |
| 2,828,454 A | 3/1958 | Khouri |
| 3,002,137 A | 9/1961 | Kahn et al. |
| 3,256,588 A | 6/1966 | Sikina et al. |
| 3,490,055 A | 1/1970 | Cox |
| 3,544,925 A | 12/1970 | Swart et al. |
| 3,569,795 A | 3/1971 | Gikow |
| 3,569,872 A | 3/1971 | Berlin |
| 3,619,220 A | 11/1971 | Maher |
| 3,859,592 A | 1/1975 | Kessler |
| 3,896,354 A | 7/1975 | Coleman et al. |
| 4,453,199 A | 6/1984 | Ritchie et al. |
| 4,720,766 A | 1/1988 | Honda |
| 4,800,459 A | 1/1989 | Takagi et al. |
| 4,947,286 A | 8/1990 | Kaneko et al. |
| 5,021,921 A | 6/1991 | Sano et al. |
| 5,040,092 A * | 8/1991 | Katho et al. ............. 361/321.2 |
| 5,093,774 A | 3/1992 | Cobb |
| 5,157,582 A | 10/1992 | Sugita et al. |
| 5,227,951 A | 7/1993 | deNeuf et al. |
| 5,258,335 A | 11/1993 | Muralidhar et al. |
| 5,430,605 A | 7/1995 | deNeuf et al. |
| 5,495,387 A | 2/1996 | Mandai et al. |
| 5,629,563 A | 5/1997 | Takiar et al. |
| 5,629,655 A | 5/1997 | Dent |
| 5,712,758 A | 1/1998 | Amano et al. |
| 5,880,925 A * | 3/1999 | DuPre et al. ........ 361/321.2 X |
| 5,889,445 A | 3/1999 | Ritter et al. |

FOREIGN PATENT DOCUMENTS

| | | |
|---|---|---|
| EP | 0379404 A2 | 7/1990 |
| EP | 0581206 A2 | 2/1994 |
| EP | 0751571 A2 | 1/1997 |
| JP | 5283283 A | 10/1993 |
| JP | 5-326317 * | 12/1993 |
| JP | 6267789 A | 9/1994 |

* cited by examiner

Primary Examiner—Justin P. Bettendorf
(74) Attorney, Agent, or Firm—Dority & Manning

(57) ABSTRACT

Both discrete and array RC components are described using cofireable resistive material as part of internal electrodes of the device. The devices include a sintered body of multilayer ceramic material in which multiple first and second electrode layers are stacked. Each of the first layers comprises at least one resistive electrode pattern extending across the sintered body between respective pairs of terminations. The second layers comprise an electrode pattern extending transverse to the resistive electrode pattern, such as between end terminations. In some embodiments, opposing side electrodes serve as input and output terminals of a respective feedthrough filter. In a feedthrough arrangement, the third terminal may be provided by one or both of the end terminals. The invention also describes an improved termination structure including a layer made from a metal oxide material.

8 Claims, 11 Drawing Sheets

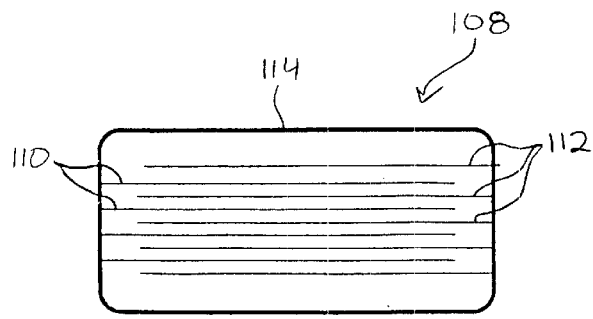
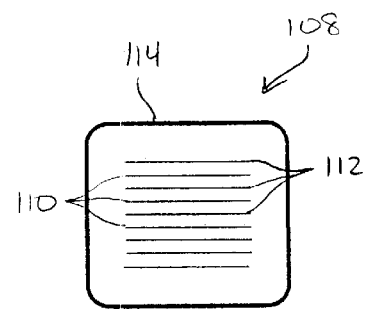
FIG. 12A  FIG. 12B
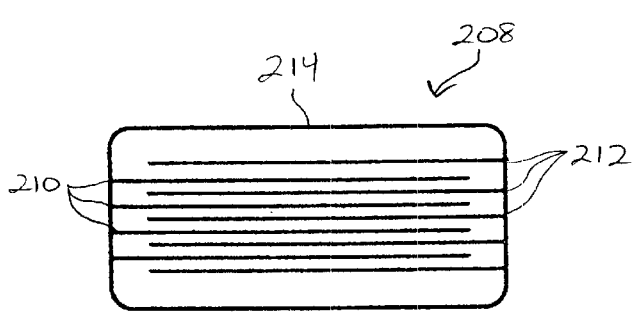
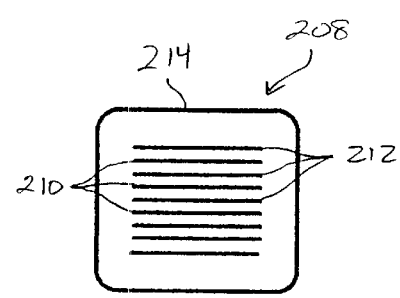
FIG. 13A  FIG. 13B
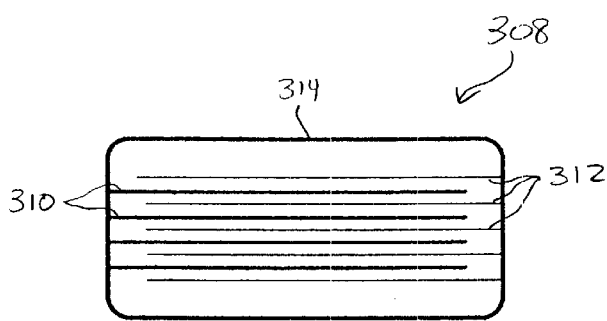
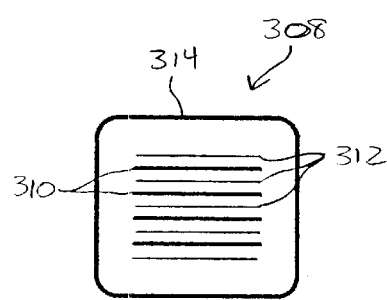
FIG. 14A  FIG. 14B

SURFACE MOUNT RC ARRAY WITH NARROW TAB PORTIONS ON EACH OF THE ELECTRODE PLATES

BACKGROUND OF THE INVENTION

The present invention relates generally to the art of surface mount electronic components. More particularly, the invention relates to electronic components of the type having a multilayer ceramic structure.

Multilayer ceramic capacitors (MLCs) have enjoyed widespread use in the electronics industry. These devices are generally constructed having a plurality of ceramic-electrode layers arranged in a stack. During manufacture, the stacked layers are pressed and sintered to achieve a substantially unitary capacitor body. The capacitor body is often rectangular in shape, with electrical terminations of opposite polarity provided along respective sides or at opposite ends. A single MLC package may contain one capacitor, or an array of multiple capacitors.

For a variety of considerations, including a desire to conserve circuit board "real estate," several types of integrated passive devices (IPDs) have been provided. For example, integrated RC devices, produced in a manner similar to MLCs, utilize a single "package" to yield a desired filtering function. Often, the capacitor of these devices will be made in a manner substantially identical to discrete MLCs. The resistor, electrically connected to the capacitor in a predetermined manner, is often applied to the outer surface of the ceramic body.

SUMMARY OF THE INVENTION

The present invention recognizes various disadvantages of prior art constructions and methods. Accordingly, it is an object of the present invention to provide novel electronic devices having a multilayer ceramic structure.

It is a further object of the present invention to provide novel integrated passive devices (IPDs) for surface mount applications.

It is an additional object of the present invention to provide novel RC components having a multilayer ceramic structure.

It is also an object of the present invention to provide a multilayer ceramic device having a novel termination structure.

Some of these objects are achieved by a composite RC device comprising a device body defined by a plurality of first ceramic layers and a plurality of second ceramic layers arranged to form a stack. Each of the first ceramic layers has at least one first electrode plate thereon, and each of the second ceramic layers has thereon a second electrode plate. A predetermined number of the first ceramic layers are respectively adjacent to a corresponding one of the second ceramic layers such that the first electrode plate will oppose the second electrode plate to form two plates of a capacitor.

In the composite RC device, either or both of the first electrode plates and the second electrode plates are at least partially formed of a cofirable resistor material. In addition, the device body has a pair of terminations electrically connected to the first electrode plate on each of the first ceramic layers. Furthermore, at least one termination is electrically connected to the second electrode plate on each of the second ceramic layers to provide a predetermined electrical function.

In some exemplary embodiments, each of the first ceramic layers comprises a plurality of side-by-side first electrode plates. These first electrode plates extend between respective first and second terminations located on the device body. For example, a total of four side-by-side first electrode plates may be provided on each of the first ceramic layers.

Often, the second electrode plates may extend between third and fourth terminations on the device body. In such cases, the first electrode plates may extend in a direction transverse to the second electrode plates. In addtion, the first electrode plates and the second electrode plates may each by formed having a wider main plate portion with narrower tab portions at each end thereof.

In other embodiments, each of the first ceramic layers may comprise a single first electrode plate extending between first and second terminations located on the device body. In this case, the second electrode plates may extend between third and fourth terminations on the device body. For example, the second electrode plates may extend in a direction transverse to the first electrode plates. Often, the first electrode plates and the second electrode plates may each be formed having a wider main plate portion with narrower tab portions at each end thereof.

Preferably, the first electrode plates include the cofirable resistor material. Resistor materials suitable for this purpose may include an appropriate metal oxide (such as ruthenium oxide) which, depending on the exigencies of a particular application, may be diluted with a suitable metal. The second electrode plates, on the other hand, may be formed of a substantially nonresistive conductive material. Materials suitable for this purpose may be selected from a group consisting of Ag, Ag/Pd, Cu, Ni, Pt, Au, Pd or other such metals.

In some exemplary embodiments, a least one blank ceramic layer is located in the stack such that the device will be provided with predetermined resistance and capacitance values. Often, the terminations may comprise an inner layer having a metal oxide material and an outer layer of solderable metal. In some exemplary embodiments, two of the second electrode plates may occupy respective topmost and bottommost positions in the stack to enhance electrical shielding of an interior thereof.

Other objects of the invention are achieved by an array device having a predetermined number of RC circuits in a singular package. The device comprises a device body defined by a plurality of first ceramic layers and a plurality of second ceramic layers arranged to form a stack. Each of the first ceramic layers has a plurality of side-by-side first electrode plates thereon, the first electrode plates being at least partially formed of a cofirable resistor material. Each of the second ceramic layers has a second electrode plate extending in a direction transverse to the first electrode plates. A predetermined number of the first ceramic layers are respectively adjacent to a corresponding one of the second ceramic layers such that the first electrode plates will oppose the second electrode plate to form two plates of a capacitor of a respective RC circuit.

The device body is also configured having a plurality of terminations on side surfaces thereof. Respective first electrode plates corresponding to one of the RC circuits are electrically connected to at least one of the terminations. Furthermore, the second electrode plates are electrically connected to at least another of the terminations.

In some exemplary embodiments, a plurality of third ceramic layers are arranged in the stack with the first ceramic layers and second ceramic layers. The third ceramic layers have thereon a plurality of side-by-side third electrode plates at least partially formed of a cofirable resistor material. A predetermined number of the third ceramic layers are respectively adjacent to a corresponding one of the second ceramic layers such that the third electrode plates will oppose the second electrode plates to form two plates of a capacitor of a respective RC circuit. Respective third electrode plates corresponding to one of the RC circuits are connected to a corresponding one of the terminations.

In such embodiments, the first ceramic layers may be alternately stacked with the second ceramic layers in a top portion of the device body. The third ceramic layers may then be alternated with the second ceramic layers in a bottom portion of the device body.

Other objects of the present invention are achieved by a miniature surface mount device comprising a device body having a unitary structure characteristic of a plurality of stacked, pressed and sintered ceramic-electrode layers. The device body includes at least two electrical terminations located on side surfaces thereof. Each of the terminations comprises an inner termination layer having a metal oxide material and an outer termination layer of solderable metal.

In some exemplary embodiments, the inner termination layer comprises a metal oxide-glass frit layer substantially similar to a material used to form resistive electrodes in the device. Often, it will be desirable to provide an intermediate termination layer of a conductive metal-glass frit between the inner termination layer and the outer termination layer. For example, the intermediate termination layer may comprise a silver-glass frit layer. In other embodiments, the outer termination layer is directly juxtaposed to the inner termination layer. Often, at least some ceramic-electrode layers of the miniature surface mount device will comprise a metal oxide electrode material, such as ruthenium oxide, mixed with a glass frit binder.

Still further objects of the invention are achieved by a method of fabricating a composite RC device. According to the method, a plurality of first ceramic layers are provided having a predetermined dielectric constant. A first selected electrode pattern is entirely formed on the first ceramic layers of a substantially nonresistive conductive material. In addition, a plurality of second ceramic layers are provided having the predetermined dielectric constant. A second selected electrode pattern is entirely formed on the second ceramic layers of a cofirable resistive material. The second electrode pattern is further configured so as to yield a desired resistance value. Furthermore, the first selected electrode pattern and the second selected electrode pattern are configured to provide a particular electrode overlap to yield a desired capacitance value.

Additional objects of the invention are achieved by a composite RC device comprising a device body having a unitary structure characteristic of a plurality of stacked, pressed and sintered ceramic-electrode layers. The device body includes at least two electrical terminations located on side surfaces thereof. The ceramic-electrode layers include a plurality of first ceramic layers having thereon a pair of first electrode plates extending to a respective termination. The ceramic-electrode layers further include a plurality of second ceramic layers having thereon a second electrode plate formed of a resistive material. The second ceramic layers are interleaved with the first ceramic layers to produce overlaps between each of the second electrode plates and a respective pair of the first electrode plates in an adjacent ceramic-electrode layer.

Other objects, features and aspects of the present invention are provided by various combinations and subcombinations of the disclosed elements, which are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which:

FIGS. 12A–B through 16A–B diagrammatically illustrate the manner in which teachings of the present invention may be utilized to achieve a variety of configurations without altering exterior dimensions of the device;

Figure 1:
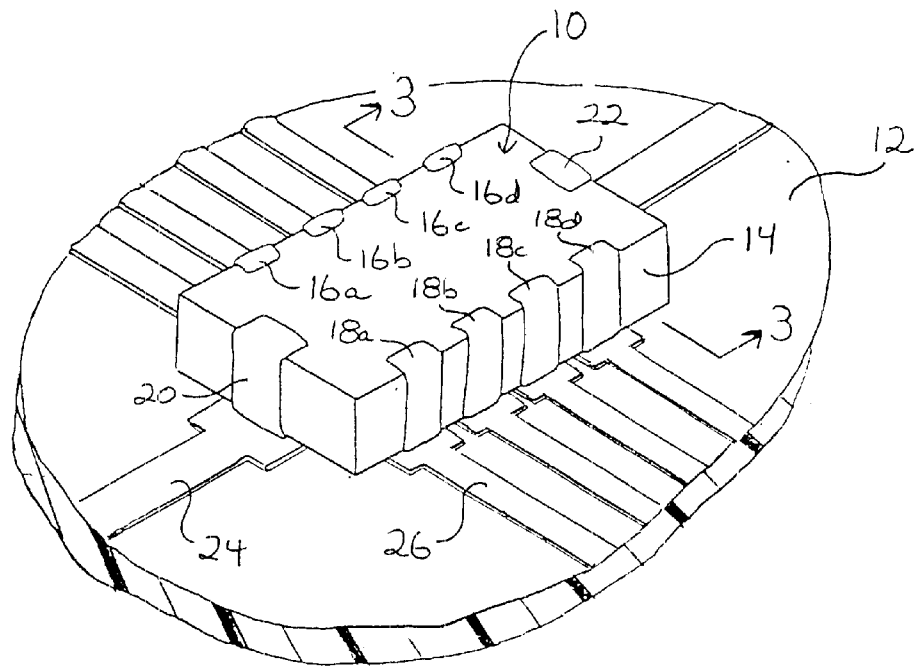
FIG. 1 is a perspective view of a surface mount RC filter array constructed in accordance with the present invention in position on a circuit board.

Repeat use of reference characters in the present specification and drawings is intended to represent same or analogous features or elements of the invention.

DETAILED DESCRIPTION OF PREFERRED EMBODIMENTS

It is to be understood by one skilled in the art that the present discussion is a description of exemplary embodiments only, and is not intended as limiting the broader aspects of the present invention, which broader aspects are embodied in the exemplary constructions.

The present invention discloses various improvements in surface mount RC devices made according to multilayer ceramic techniques. Surface mount RC devices having internal resistor structures are shown in commonly-assigned U.S. Pat. No. 5,889,445, incorporated herein by reference. Generally, these devices are constructed having a unitary body characteristic of a plurality of stacked, pressed and sintered ceramic-electrode layers. Terminations are applied to the surfaces of the body for electrical connection to external circuitry. According to industry practice, the size of such devices may be expressed as a number "XXYY," with XX and YY being the length and width in hundredths of an inch. Some typical sizes for devices of the present invention as expressed under this practice are 0603, 0805, 1206, 1210 and 1812.

Figure 2:
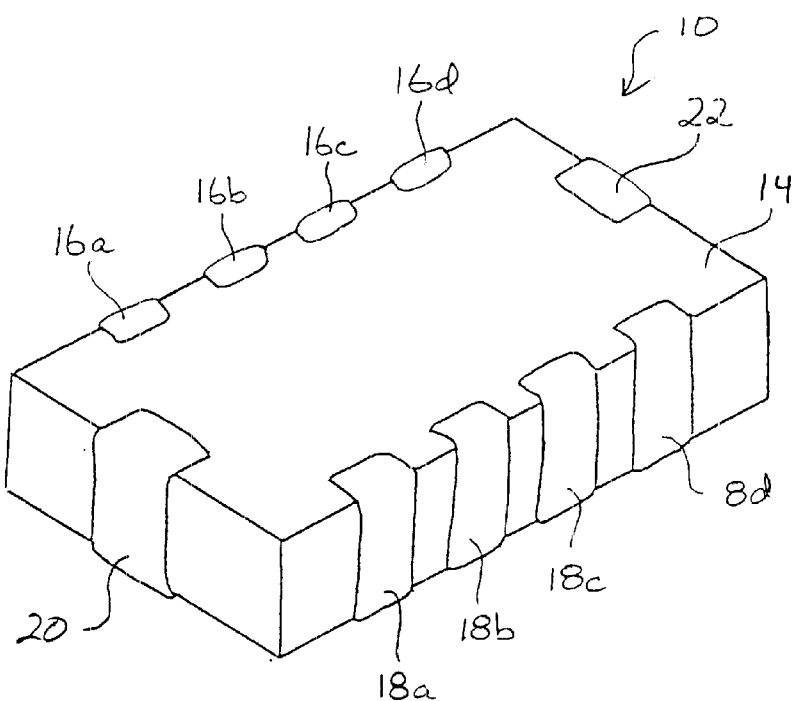
FIG. 2 is an enlarged perspective view of the filter array of FIG. 1.

FIG. 1 illustrates a surface mount RC array 10 of the present invention mounted to a circuit board 12. As can also be seen in FIG. 2, array 10 includes a main body 14 of relatively small size. A plurality of terminations 16a–d and 18a–d are located on respective sides of main body 14, with terminations 20 and 22 being similarly located at respective ends thereof. While terminations 20 and 22 are here shown only partially covering the end of main body 14, it is contemplated that these terminations may cover the entire end surface in some embodiments.

As shown in FIG. 1, the various terminations of the body 14 align with respective conductive paths, such as traces 24 and 26, defined on the surface of circuit board 12. Electrical connection between each termination and its associated conductive path may be effected by soldering. Typically, circuit board 12 may be made from a low-temperature organic material, with the solder being a low temperature eutectic solder applied by wave or reflow soldering techniques.

Figure 3:
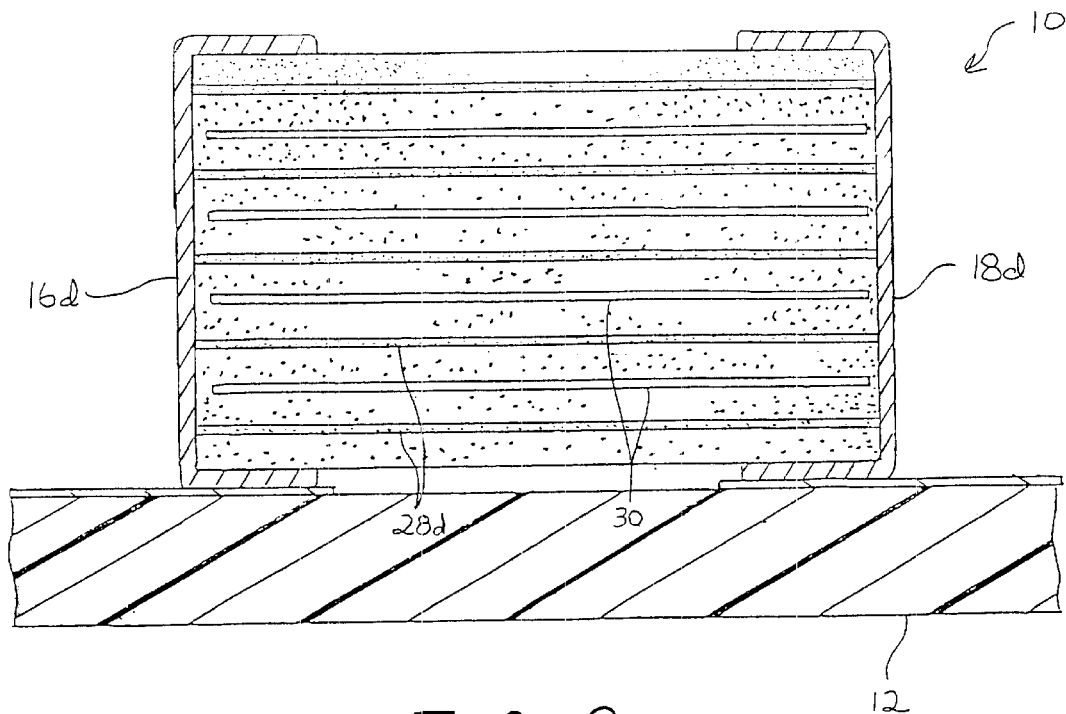
FIG. 3 is a cross sectional view as taken along line 3—3 of FIG. 1.

Referring now to FIG. 3, the internal construction of main body 14 will be explained. As can be seen, main body 14 includes a plurality of first electrode plates (such as plates 28d) situated in opposed and spaced apart relation with a plurality of second electrode plates 30. The electrode plates are separated by layers of ceramic material to provide a predetermined dielectric constant. Capacitor body 14 is typically made by stacking ceramic-electrode layers formed using conventional dicing techniques, which are then pressed and sintered in a kiln. Generally, main body 14 will comprise approximately 5–50 ceramic-electrode layers stacked in this manner.

Figures 4A, 4B:
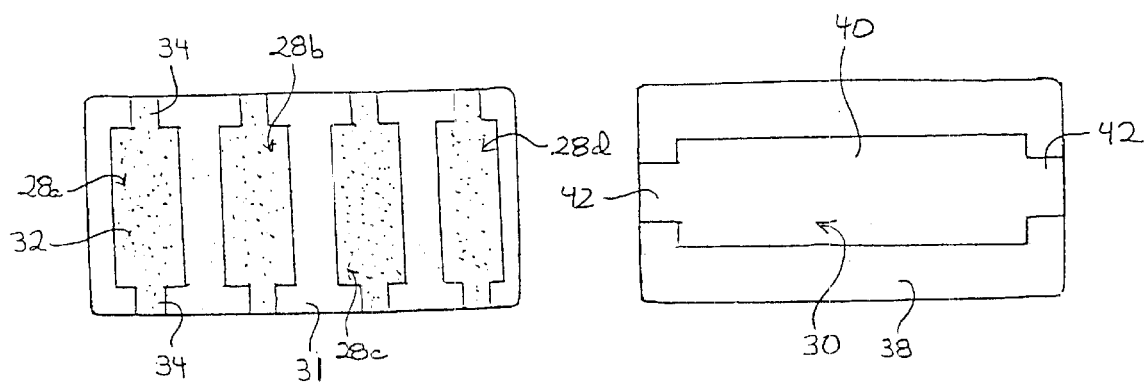
FIGS. 4A and 4B are plan views of a first layer and a second layer as may be alternated and stacked to form the filter array of FIG. 1.

As shown in FIG. 4A, each of the first electrode plates may comprise a plurality of side-by-side electrode plates (designated 28a–d) formed on the surface of a first ceramic layer 31. In this case, each of the first electrode plates is configured to have a main plate portion (such as main plate portion 32) between a pair of tab portions (such as tab portions 34). The tab portions extend to, and are electrically connected with, respective pairs of side terminations.

Referring now to FIG. 4B, each of the second electrode plates 30 may be formed as a single electrode plate on the surface of a second ceramic layer 38. As shown, electrode plate 30, which has a main plate portion 40 between a pair of tab portions 42, preferably extends in a direction transverse to the direction of first electrode plates 28a–d. Tab portions 42 are electrically connected with respective end terminations 20 and 22.

Preferably, electrode plates 28a–d are at least partially formed of a cofirable resistor material, such as a combination including a suitable metal oxide and glass frit. For example, some presently preferred embodiments employ ruthenium oxide as the metal oxide material. As a result, the electrode pattern not only serves as one plate of a capacitor, but also serves as a resistor. The use of a cofirable material permits single fire processing, which simplifies processing in relation to many prior art arrangements.

In the illustrated embodiment, electrode plates 28a–d are entirely formed from the resistor material. The opposed capacitor plates 30 are preferably formed of a conductive material from the family of noble and base metals that are traditionally used in cofired electronic components and packages. For example, capacitor plates 30 may be formed from Ag, Ag/Pd, Cu, Ni, Pt, Au, Pd or the like. In some embodiments, however, it may be desirable to also form electrode plates 28a–d of the cofirable resistor material.

Figure 5:
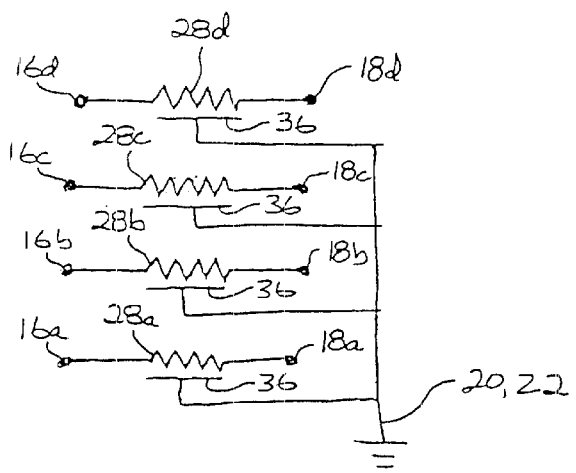
FIG. 5 is an electrical schematic showing an equivalent circuit realized by the filter array of FIG. 1.

As will be appreciated, the illustrated embodiment provides a total of four RC devices in a single package. Often, each pair of side terminations will serve as the respective input and output terminals of one RC device. One or both of the end terminals 20 and 22 may be grounded to provide a three-terminal feedthrough arrangement, as schematically illustrated in FIG. 5.

In the illustrated embodiment, the R and C values of the respective RC devices can be adjusted by varying the overall number of ceramic layers. Due to the parallel arrangement of the resistors, more plates 28 will yield a lower R value. Because parallel capacitors are additive, fewer plates 30 will yield a lower C value. The values of R and C can be adjusted independently by selectively applying the "capacitor" or "resistor" layers.

Figure 6A:
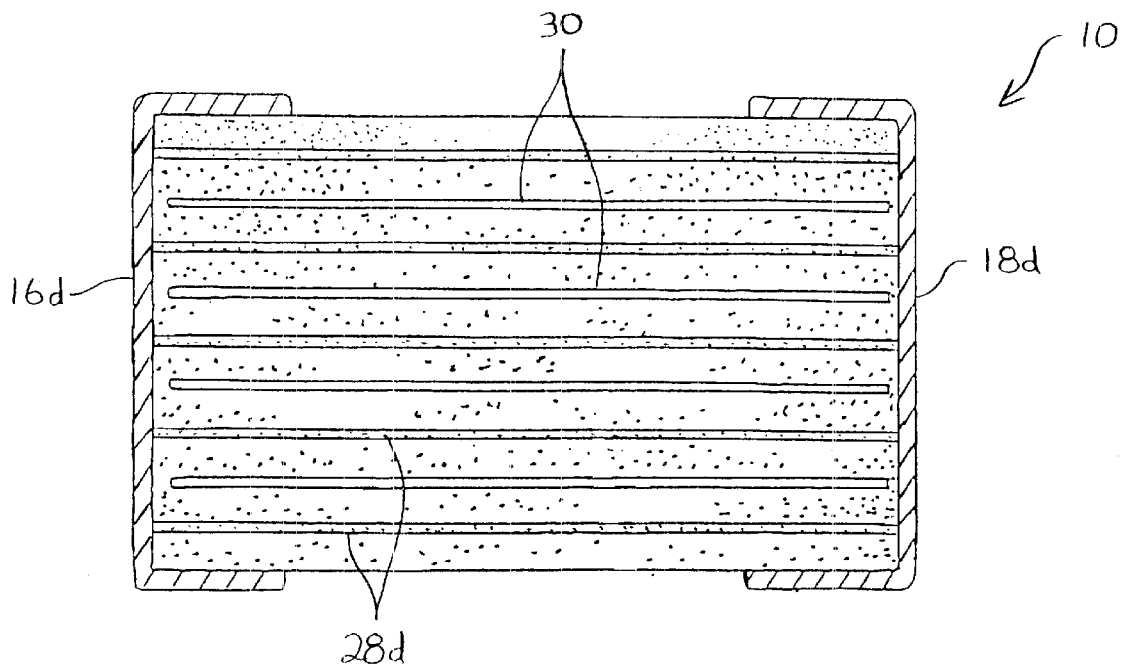
FIGS. 6A and 6B are cross-sectional views similar to FIG. 3 illustrating the manner in which device capacitance can be adjusted independently of device resistance in the array device of FIG. 1.
Figure 6B:
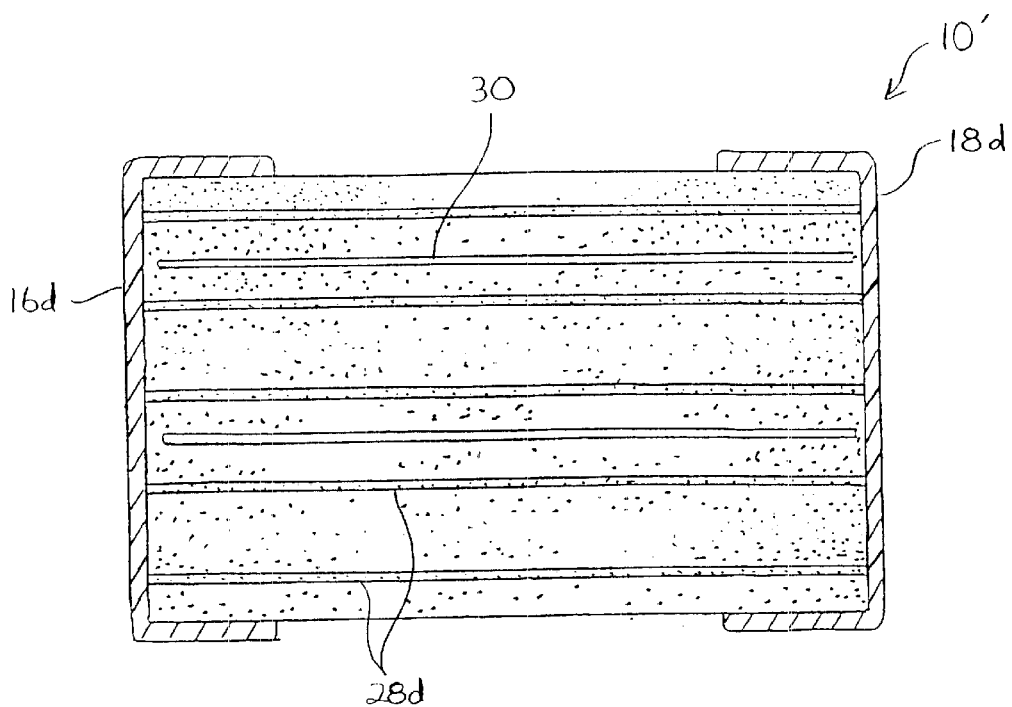

This can be explained most easily with reference to FIGS. 6A and 6B. In FIG. 6A, array 10 is constructed so that every potential position for an electrode plate is populated. The resistance between terminal 16d and 18d is determined by the single layer resistance of each plate 28d, and the number of layers in parallel. Capacitance is determined by the number of combinations of plates 28d and plates 30. Thus, device capacitance can be adjusted independently of device resistance by altering the structure within the cofired body. Specifically, it is possible to vary the values of resistance and/or capacitance by interrupting the usual sequence of the plates.

In this regard, FIG. 6B illustrates a device 10' wherein two plate positions that could be occupied by a plate 30 are shown to be vacant. As a result, device 10', otherwise identical to device 10, will exhibit a lower capacitance. Because the number of plates 28d remains the same, however, the resistance between terminations 16d and 18d remains unchanged.

Figure 7:
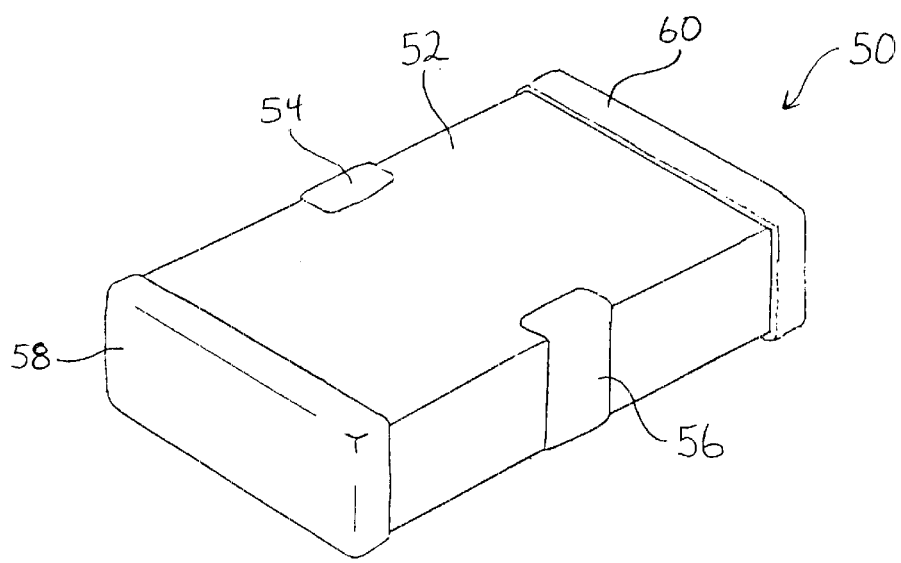
FIG. 7 is a perspective view of a discrete RC filter device constructed in accordance with the present invention.

FIG. 7 illustrates a discrete RC device 50 constructed in accordance with the present invention. Like array 10, device 50 includes a device body 52 manufactured from a plurality of ceramic electrode layers arranged to form a stack. A pair of terminations 54 and 56 are located on respective sides of device body 52, as shown. Terminations 58 and 60 are located at the respective ends of device body 52.

Figure 8A:
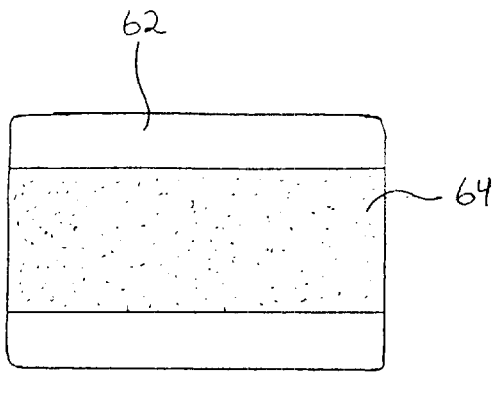
FIGS. 8A and 8B are plan views of a first layer and a second layer as may be alternated and stacked to form the filter device of FIG. 7.
Figure 8B:
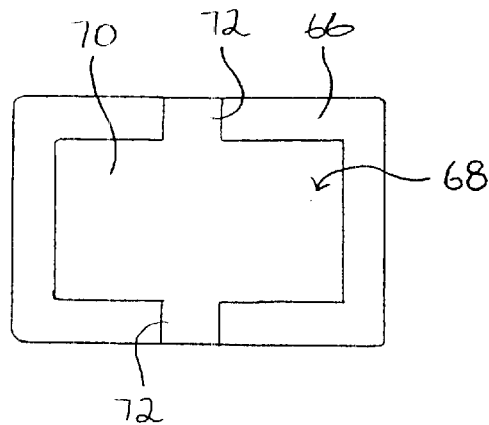

FIGS. 8A and 8B illustrate the ceramic layers that can be alternated in the fabrication of device body 52. As shown in FIG. 8A, the first ceramic layer 62 has a first electrode plate 64 located thereon. The plates 64 are configured to extend between terminations 58 and 60. Plate 64 may be formed entirely of a cofireable resistor material as described above.

As shown in FIG. 8B, each of the second ceramic layers 66 includes a second ceramic plate 68, which serve as counterelectrodes in the eventual capacitor. In this case, second electrode plates 68 are configured to have a main plate portion 70 and a pair of tab portions 72. The tab portions 72 extend to respective terminations 54 and 56 located on the lateral sides of device body 52. Depending on the requirements of a particular application, electrode plates 68 may be formed of a substantially nonresistive material, or may be formed of a cofireable resistor material.

Figure 9:
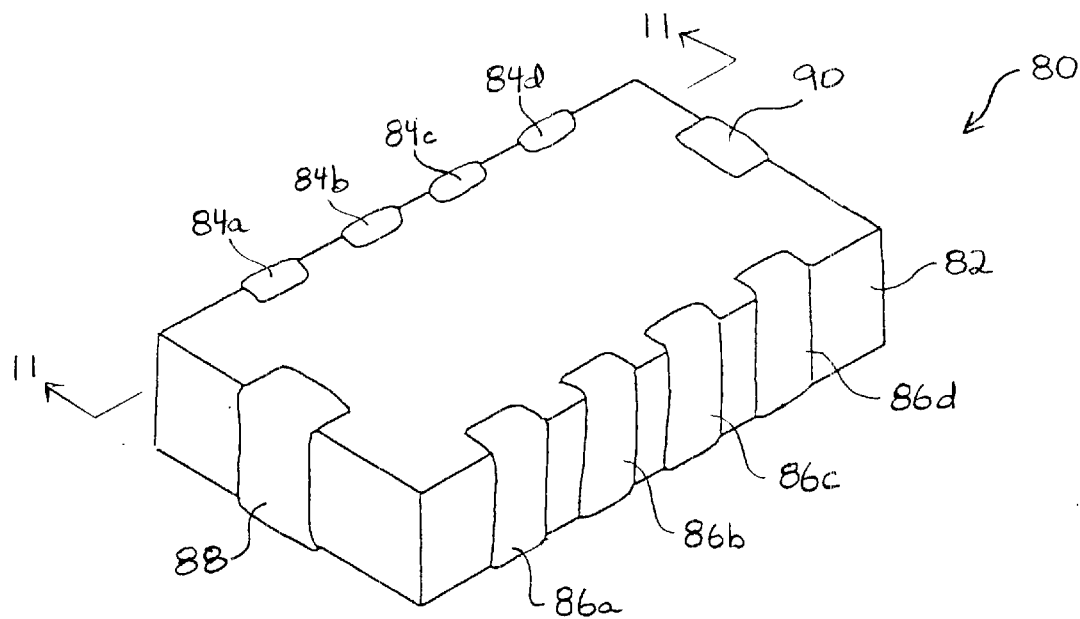
FIG. 9 is a perspective view of an alternative RC filter array constructed in accordance with the present invention.

FIG. 9 illustrates an alternative embodiment which is similar in its external appearance to array 10. Specifically, FIG. 9 illustrates an array 80 having a device body 82 formed of a plurality of ceramic-electrode layers arranged in a stack. The lateral sides of body 82 carry a plurality of opposite terminations 84a–d and 86a–d.

In this case, array 80 is configured to yield a total of eight different RC circuits in a single package. Instead of three-terminal feedthrough arrangements as described above, the RC circuits of array 80 are configured as two terminal series circuits.

Figure 10A:
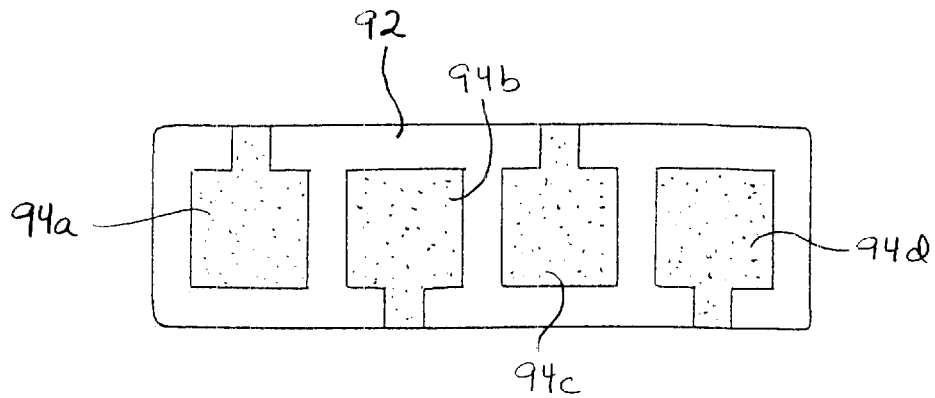
FIGS. 10A, 10B and 10C are plan views of a first layer, a second layer and a third layer as may be alternated and stacked to form the RC filter array of FIG. 9.
Figure 10B:
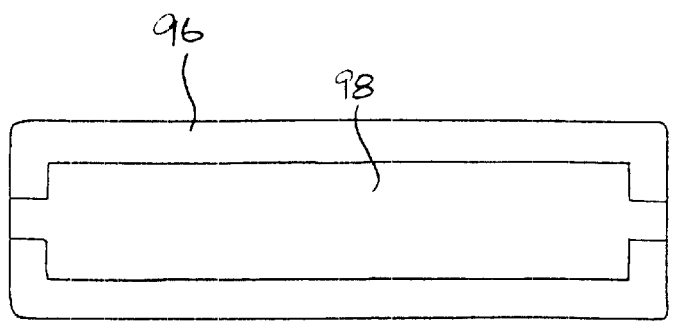
Figure 10C:
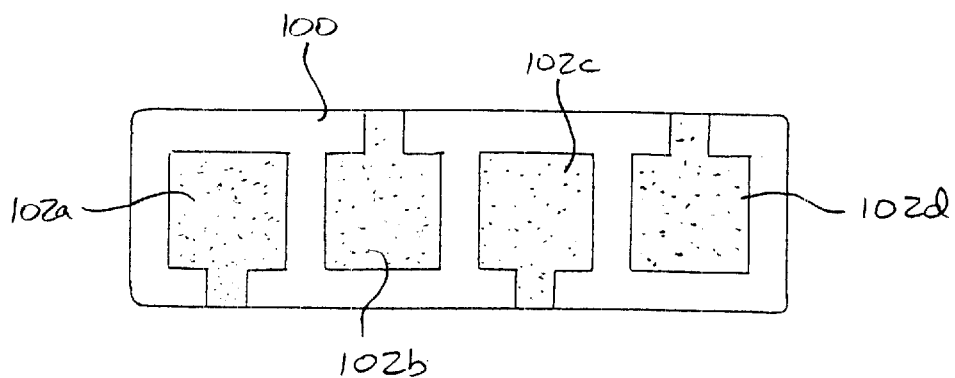

FIGS. 10A–10C illustrate the three different ceramic layers that can be stacked in the manufacture of device body 82. As shown in FIG. 10A, first ceramic layer 92 includes a total of four electrode plates 94a–d. As shown, plates 94a–d are arranged side by side, with the tab portion of every other plate extending to opposite sides of the device. Thus, electrode plates 94a and 94c will be electrically connected to terminations 84a and 84c, with electrode plates 94b and 94d being connected to terminations 86b and 86d, respectively.

Referring to FIG. 10B, the second ceramic layers 96 each include an elongate electrode plate 98 extending to opposite ends of device body 82. As such, electrode plates 98, which will serve as counter electrodes in the multilayer capacitor structure, will be electrically connected to terminations 88 and 90.

Referring now to FIG. 10C, third ceramic layer 100 includes a plurality of third electrode plates 102a–d. Like electrode plates 94a–d, electrode plates 102a–d are arranged such that the tab portion of every other plate extends to opposite sides of device body 82. Thus, electrode plates 102a and 102c will be electrically connected to terminations 86a and 86c, respectively. Similarly, electrode plates 102b and 102d will be electrically connected to terminations 84b and 84d.

Preferably, electrode plates 94a–d and 102a–d are formed of a cofireable resistor material as described above. In such embodiments, electrode plates 98 will often be formed of a substantially nonresistive material. In this manner, each of the RC circuits may have substantially equivalent values of both resistance and capacitance.

Embodiments are also contemplated, however, in which only electrode plates 98, or all of the electrode plates in the device, are formed of the resistive material. Such a construction may be advantageous to provide different values of resistance among the various RC circuits in the array. For example, the interior circuits may have a higher resistance value if electrode plates 98 are made of a resistive material, since there will be a longer resistive path from the counter-electrode of the capacitor to the end termination for these circuits.

Figure 11:
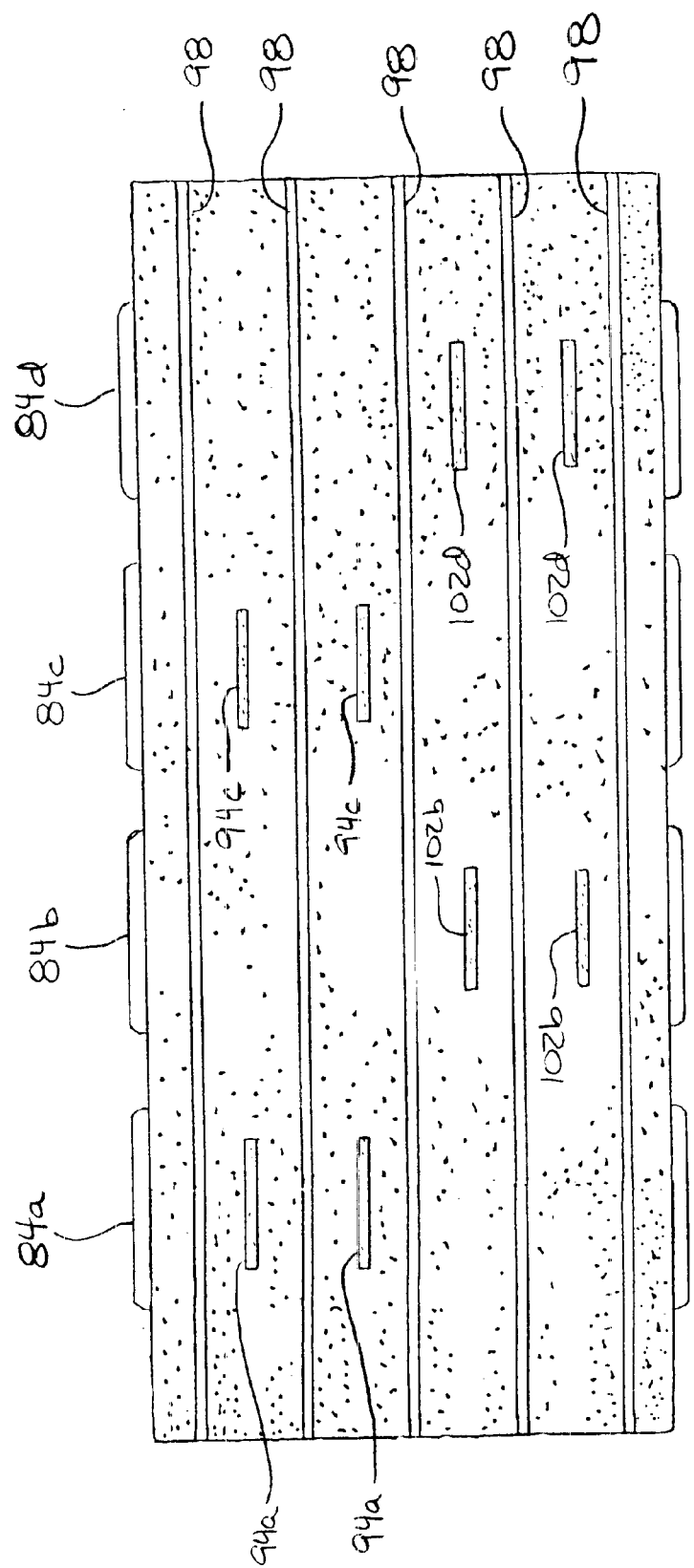
FIG. 11 is a cross-sectional view as taken along line 11—11 of FIG. 9.

FIG. 11 illustrates one stacking arrangement which may be utilized to produce array 80. In this case, the first ceramic layers are alternated with the second ceramic layers in the top portion of the stack. In the bottom portion of the stack, the second ceramic layers are alternated with the third ceramic layers. According to one preferred arrangement, second electrodes 98 will occupy both the topmost and bottommost positions in the stack. This is advantageous to provide a degree of electrical shielding to the interior of the device.

As noted above, the present invention provides a high degree of flexibility in the manufacturing process. Depending on the desired values of resistance and capacitance, ceramic layers may be left blank, or the physical dimensions of the layers may be changed. A wide variety of different circuits can be easily created within a single component size. A series of examples will now be described to demonstrate this flexibility.

FIGS. 12A and 12B are side and transverse sectional views, respectively, diagrammatically illustrating the construction of a typical multilayer ceramic capacitor 108. As can be seen, a plurality of first polarity plates 110 are interleaved with a plurality of second polarity plates 112, which extend to opposite ends of body 114. In this prior art arrangement, the capacitor plates are formed of a conductive material, such as Ag/Pd.

FIGS. 13A and 13B illustrate an RC device wherein the opposite polarity plates are made from a cofireable resistive material, such as ruthenium oxide and glass frit. Device 208 will exhibit a capacitance substantially identical to that of device 108 but will have a much higher series resistance value.

FIGS. 14A and 14B illustrate a further alternative 308 wherein first polarity plates 310 are formed from the resistive material. Second polarity plates 312, on the other hand, are formed in this case from the conductive material. Device 308 will exhibit a capacitance substantially identical to that of devices 108 and 208, but will exhibit a greatly reduced value of resistance.

Figure 15A:
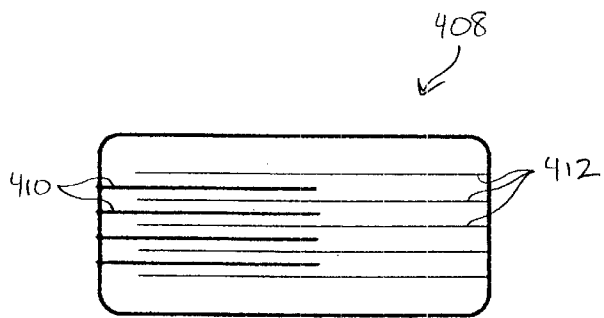
Figure 15B:
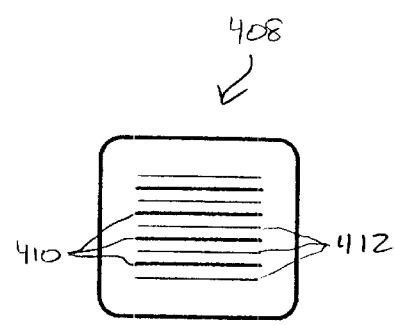

FIGS. 15A and 15B illustrate an RC device 408 having first polarity terminals 410 made from the resistive material. Electrode plates 412, on the other hand, are formed of the conductive material. In this case, electrode plates 412 are configured to provide a smaller overlap area than in the embodiments discussed above. As a result, device 408 will exhibit a smaller capacitance. In addition, the resistance value will be lower than that of devices 208 and 308 due to the shorter length of resistive material.

Figure 16A:
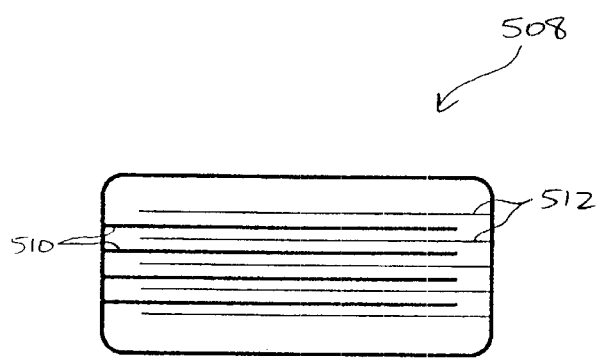
Figure 16B:
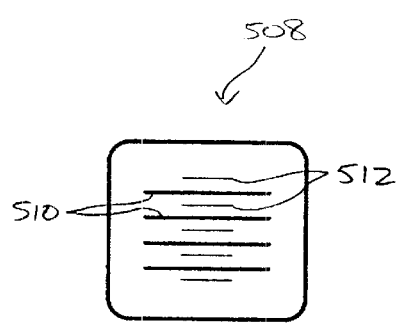

FIGS. 16A and 16B illustrate a still further alternative device 508, in which the first polarity electrode plates 510 are made from the resistive material. Electrode plates 512, on the other hand, are formed from the conductive material. It can be seen that plates 510 are configured to have a length and area approximately equivalent to plates 310 of device 308. Plates 512, however, are configured to have a relatively narrow width. Thus, in comparison to device 308, device 508 will exhibit a lower capacitance value. The resistance value, however, will not be substantially changed.

The following table represents theoretical capacitance and resistance values that may be achieved in one family of examples as described above, assuming use of ruthenium oxide as the resistive material and Ag/Pd as the conductive material:

| DEVICE | RESISTANCE | CAPACITANCE |
| --- | --- | --- |
| 108 | 0.006 Ohms | 39.6 pF |
| 208 | 80.1 Ohms | 39.6 pF |
| 308 | 43.0 Ohms | 39.6 pF |
| 408 | 26.3 Ohms | 19.9 pF |
| 508 | 35.3 Ohms | 21.8 pF |

Thus, within a single component size, the present invention allows a wide variety of different RC circuits to be manufactured to meet the needs of a particular application.

The above examples demonstrate that variations in plate geometry can yield different resistance and capacitance values. Further variations can be achieved, however, by altering the materials from which the electrode plates are made. For example, a conductive metal, such as silver, may be selectively added to the metal oxide/glass frit material to lower the resistance of the material.

Figure 18:
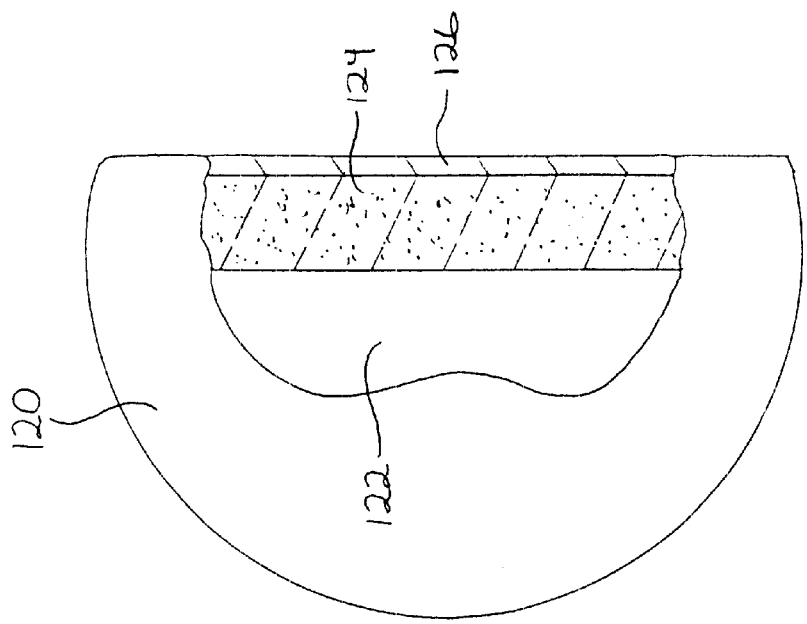
FIG. 18 is an enlarged view of the area so indicated in FIG. 17.
Figure 17:
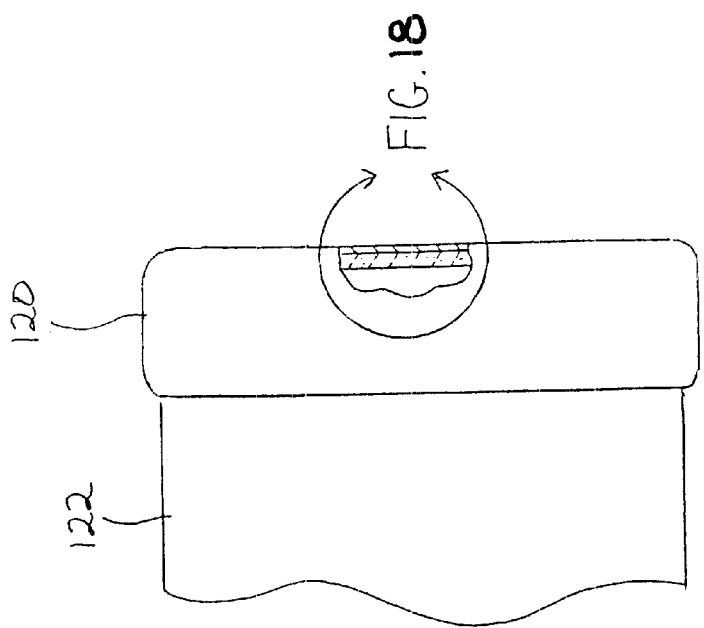
FIG. 17 is a fragmentary view of a multilayer ceramic device having a novel termination structure in accordance with the present invention.

The present invention also provides an improved termination structure for use with a multilayer ceramic device. Referring now to FIG. 17, a termination 120 of the present invention is shown covering an end surface of a device body 122. As can be seen in FIG. 18, termination 120 includes an inner termination layer 124 and an outer termination layer 126.

Where the device includes internal electrodes formed of a ceramic material, such as the metal oxide and glass frit material described above, inner layer 124 is preferably formed from a chemically similar material. For example, in one preferred implementation, the termination material may be made from about equal parts of $RuO_2$ and glass frit, which is fired onto the body 122 when it is sintered. Although layer 124 is made from a resistive material in this example, it will not add appreciable resistance to the overall device. This is due to the relatively small thickness of the resistive layer.

Termination layer 126, on the other hand, is typically formed of SnPb, Ni or other solderable metal. Preferably, layer 126 is applied to the device body after sintering as has been done in the past.

When the improved termination of the present invention is used with an RC device having resistive electrodes, inner termination layer 124 may be formed from an identical material. Because the two materials are the same, the termination will readily bond with the internal electrodes during the firing process. This is in contrast with fired-on termination materials of the prior art, such as a silver-glass frit material, which may not readily adhere to a metal oxide electrode.

Figure 19:
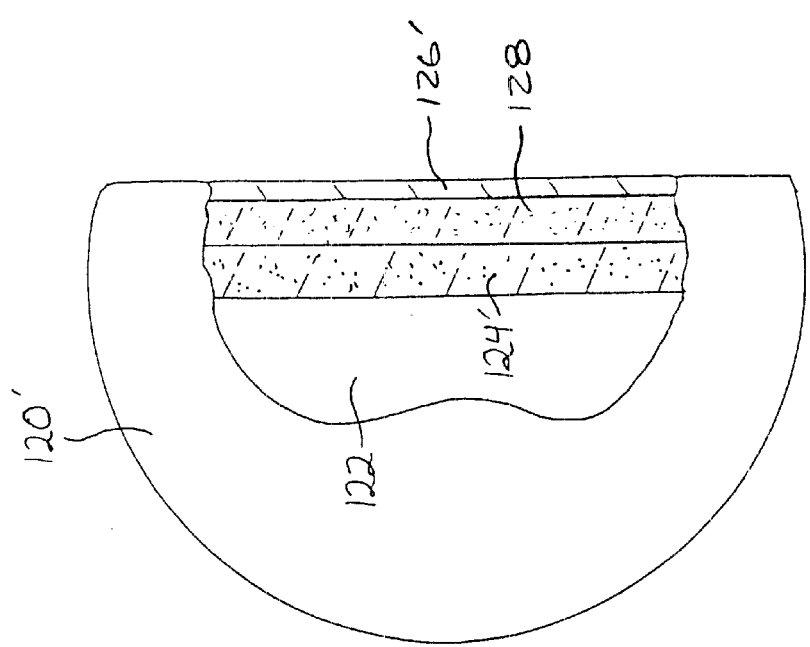
FIG. 19 is a view similar to FIG. 18 illustrating an alternative termination structure.

FIG. 19 illustrates an alternative termination structure 120' constructed in accordance with the present invention. Termination structure 120' includes an inner termination layer 124' and an outer termination layer 126' similar to layers 124 and 126, respectively. In this case, an intermediate termination layer 128 is provided between termination layers 124' and 126'. Termination layer 128 is formed of a prior art fired-on termination material of conductive metal and glass frit. For example, a silver/glass frit material of the type typically used in component terminations of the prior art may be used for this purpose. Structure 120 may be advantageous to provide a good bond to resistive internal electrodes, while at the same time otherwise appearing as a termination structure of the prior art.

An improved termination structure made in accordance with the present invention has been found to offer a number of benefits in certain applications. For example, where an internal electrode of resistive material is used, the like material of the termination structure provides excellent electrical contact. In addition, the termination structure will provide excellent electrical contact to conductive internal electrodes such as Ag/Pd electrodes and the like. The termination structure will also achieve excellent mechanical bond to the ceramic chip itself for a strong, well-adhered termination. Moreover, the metal oxide termination offers very well-matched thermal expansion properties between the chip and termination to reduce thermal-cycle induced failures.

In the above embodiments, resistive electrodes have been shown above as forming the entire electrode pattern. Embodiments are contemplated, however, wherein part of the electrode is formed from resistive material and part is formed from a traditional conductive material. In this regard, a conductive tab may be provided between the termination and an electrode plate formed of resistive material. This may be particularly advantageous where it is desired to utilize a traditional conductive metal/glass frit termination material as the inner layer of the termination structure. Alternatively, the electrode plate may be formed of a conductive material, with the resistive material forming a series resistor between it and the termination.

Figure 20:
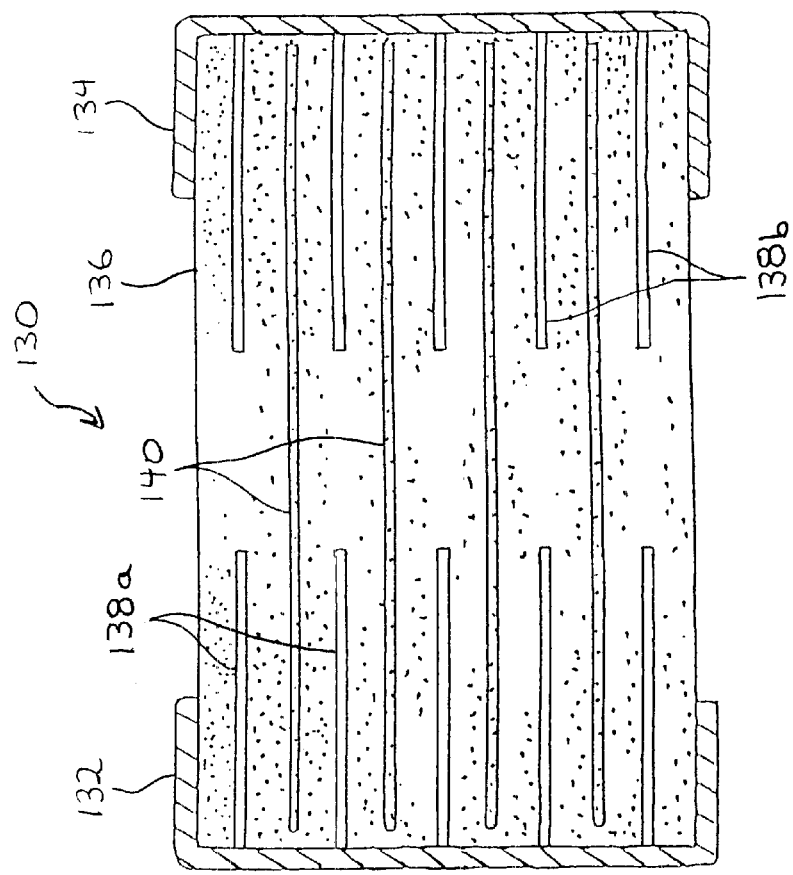
FIG. 20 is a cross-sectional view showing the interior construction of a still further alternative device constructed in accordance with the present invention.

FIG. 20 illustrates a still further embodiment constructed in accordance with the present invention. In this case, a device 130 is depicted having terminations 132 and 134 located at respective ends of a sintered body 136. Each of the first ceramic layers defines a pair of conductive capacitor plates 138a–b extending to a respective termination. The second ceramic layers each define a resistive plate 140 which is not directly connected to either of the terminations. Instead, resistive plates 140 are configured to overlap a portion of plates 138a–b to yield a predetermined capacitance. Electrically, the resulting structure will be equivalent to a series capacitor-resistor-capacitor, wherein the resistance and capacitance values can be adjusted as described above.

It can thus be seen that the present invention provides improved RC devices that accomplish the various objectives set forth above. While preferred embodiments of the invention have been shown and described, modifications and variations may be made thereto by those of ordinary skill in the art without departing from the spirit and scope of the invention. It should also be understood that aspects of the various embodiments may be interchanged both in whole or in part. Furthermore, those of ordinary skill in the art will appreciate that the foregoing description is by way of example only, and is not intended to be limitative of the invention so further described in the appended claims.

What is claimed is:

1. A composite RC device, said device comprising:

a device body defined by a plurality of first ceramic layers and a plurality of second ceramic layers arranged to form a stack;

each of said first ceramic layers having thereon a plurality of first electrode plates oriented in a side-by-side configuration;

each of said second ceramic layers having a second electrode plate, each said second ceramic layer being respectively adjacent to a corresponding said first ceramic layer such that each of said plurality of first electrode plates on a given first ceramic layer will oppose a selected said second electrode plate to form the two plates of a capacitor;

said plurality of first electrode plates being at least partially formed of a cofirable resistor material and said second electrode plates being formed of a substantially nonresistive conductive material;

said device body having respective pairs of terminations electrically connected to each first electrode plate on each of said first ceramic layers, and further having at least one termination electrically connected to said second electrode plate on each of said second ceramic layers to provide a predetermined electrical function; and wherein said first electrode plates and said second electrode plates are each formed having a wider main plate portion with narrower tab portions at each end thereof.

2. A composite RC device as set forth in claim 1, comprising a total of four of said side-by-side first electrode plates on each of said first ceramic layers.

3. A composite RC device as set forth in claim 1, wherein each first electrode plate extends between respective first and second terminations located on opposing sides of said device body.

4. A composite RC device as set forth in claim 3, wherein said second electrode plates extend between third and fourth terminations on said device body.

5. A composite RC device as set forth in claim 4, wherein second electrode plates extend in a direction transverse to said first electrode plates.

6. A composite RC device as set forth in claim 1, wherein said cofirable resistor material comprises ruthenium oxide.

7. A composite RC device as set forth in claim 1, wherein said substantially nonresistive conductive material is selected from a group consisting of Ag, Ag/Pd, Cu, Ni, Pt, Au and Pd.

8. A composite RC device as set forth in claim 1, further comprising at least one blank ceramic layer located in said stack such that said device will be provided with predetermined resistance and capacitance values.

* * * * *